(12) United States Patent
Cho

(10) Patent No.: US 9,911,679 B2
(45) Date of Patent: *Mar. 6, 2018

(54) SEMICONDUCTOR PACKAGE WITH INTEGRATED OUTPUT INDUCTOR ON A PRINTED CIRCUIT BOARD

(71) Applicant: Infineon Techonologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/425,614

(22) Filed: Feb. 6, 2017

(65) Prior Publication Data

US 2017/0148705 A1    May 25, 2017

Related U.S. Application Data

(63) Continuation of application No. 15/013,719, filed on Feb. 2, 2016, now Pat. No. 9,565,768.

(Continued)

(51) Int. Cl.
*H01L 23/367*   (2006.01)
*H05K 1/18*     (2006.01)
(Continued)

(52) U.S. Cl.
CPC ....... *H01L 23/3675* (2013.01); *H01F 1/0306* (2013.01); *H01F 27/24* (2013.01); *H01L 23/3121* (2013.01); *H01L 23/49838* (2013.01); *H01L 24/32* (2013.01); *H01L 25/18* (2013.01); *H05K 1/185* (2013.01); *H01L 2224/2919* (2013.01); *H01L 2224/32265* (2013.01); (Continued)

(58) Field of Classification Search
None
See application file for complete search history.

(56) References Cited

U.S. PATENT DOCUMENTS 6,996,892 B1 * 2/2006 Dening ............... H01F 17/0013
29/602.1
8,148,815 B2    4/2012 Girdhar et al.
(Continued)

OTHER PUBLICATIONS

Notice of Allowance from U.S. Appl. No. 15/013,719, dated Sep. 29, 2016, 8 pp.

*Primary Examiner* — Andres Munoz
(74) *Attorney, Agent, or Firm* — Shumaker & Sieffert, P.A.

(57) ABSTRACT

A semiconductor package includes a semiconductor die comprising a control transistor and a sync transistor, an integrated output inductor comprising a winding around a core, and coupled to the semiconductor die. The winding comprises a plurality of conductive clips situated above a printed circuit board (PCB) and connected to a plurality of conductive segments in the PCB. The control transistor and the sync transistor are configured as a half-bridge. The integrated output inductor is coupled to a switched node of the half-bridge. At least one of the plurality of conductive clips includes a partially etched portion and a non-etched portion. The semiconductor die is attached to the integrated output inductor by a die attach material. The semiconductor die and the integrated output inductor are encapsulated in a molding compound.

20 Claims, 5 Drawing Sheets

Related U.S. Application Data

(60) Provisional application No. 62/137,938, filed on Mar. 25, 2015.

(51) Int. Cl.
    *H01L 25/18* (2006.01)
    *H01L 23/00* (2006.01)
    *H01L 23/31* (2006.01)
    *H01L 23/498* (2006.01)
    *H01F 27/24* (2006.01)
    *H01F 1/03* (2006.01)

(52) U.S. Cl.
    CPC ............... *H01L 2224/45124* (2013.01); *H01L 2224/45144* (2013.01); *H01L 2224/45147* (2013.01); *H01L 2224/48091* (2013.01); *H01L 2224/48106* (2013.01); *H01L 2224/48227* (2013.01); *H01L 2224/73265* (2013.01); *H01L 2924/0665* (2013.01); *H01L 2924/1033* (2013.01); *H01L 2924/10253* (2013.01); *H01L 2924/13055* (2013.01); *H01L 2924/13064* (2013.01); *H01L 2924/13091* (2013.01); *H01L 2924/1426* (2013.01); *H01L 2924/1427* (2013.01); *H01L 2924/14252* (2013.01); *H01L 2924/15724* (2013.01); *H01L 2924/15747* (2013.01); *H01L 2924/19011* (2013.01); *H01L 2924/19042* (2013.01); *H01L 2924/19102* (2013.01)

(56) References Cited

U.S. PATENT DOCUMENTS

| | | |
|---|---|---|
| 9,190,383 B2 | 11/2015 | Cho et al. |
| 9,437,570 B2 | 9/2016 | Cho et al. |
| 9,565,768 B2 * | 2/2017 | Cho .................. H01L 23/645 |
| 2004/0179383 A1 | 9/2004 | Edo et al. |
| 2005/0052268 A1 | 3/2005 | Pleskach et al. |
| 2006/0227518 A1 | 10/2006 | Nishio et al. |
| 2007/0076392 A1 | 4/2007 | Urashima et al. |
| 2008/0122418 A1 | 5/2008 | Briere et al. |
| 2013/0056847 A1 | 3/2013 | Chen |
| 2013/0221442 A1 | 8/2013 | Joshi |
| 2016/0104665 A1 | 4/2016 | Cho et al. |

* cited by examiner

US 9,911,679 B2

SEMICONDUCTOR PACKAGE WITH INTEGRATED OUTPUT INDUCTOR ON A PRINTED CIRCUIT BOARD

CROSS-REFERENCE TO RELATED APPLICATIONS

The present application is a continuation of U.S. Nonprovisional patent application Ser. No. 15/013,719, filed 2 Feb. 2016, which claims benefit of U.S. Provisional Application Ser. No. 62/137,938, filed 25 Mar. 2015, the entirety of each one of which is hereby incorporated by reference.

BACKGROUND

Power converters, such as voltage regulators, are used in a variety of electronic circuits and systems. For instance, integrated circuit (IC) applications may require conversion of a direct current (DC) input to a lower, or higher, DC output. As an example, a buck converter may be implemented as a voltage regulator to convert a higher voltage DC input to a lower voltage DC output for use in low voltage applications. Semiconductor packaging solutions for power converters may be configured to accommodate power transistors and an output inductor.

In conventional semiconductor packages, the output inductor utilized in the power converter is placed side by side with the power transistors, and mounted over a top surface of a printed circuit board or a substrate. The lateral placement of the output inductor with the other components increases the overall size of the semiconductor package. Also, in the conventional semiconductor packages, the output inductor is a pre-formed inductor with a relatively large form factor and poor thermal performance. Integrating the pre-formed inductor with the power transistors can further increase the overall form factor of the semiconductor package and degrade the thermal performance.

Accordingly, there is a need to overcome the drawbacks and deficiencies in the art by providing a semiconductor package having an integrated output inductor on a printed circuit board, with reduced form factor and enhanced thermal dissipation.

SUMMARY

The present disclosure is directed to a semiconductor package with an integrated output inductor on a printed circuit board (PCB), substantially as shown in and/or described in connection with at least one of the figures, and as set forth in the claims.

DETAILED DESCRIPTION

Figure 1:
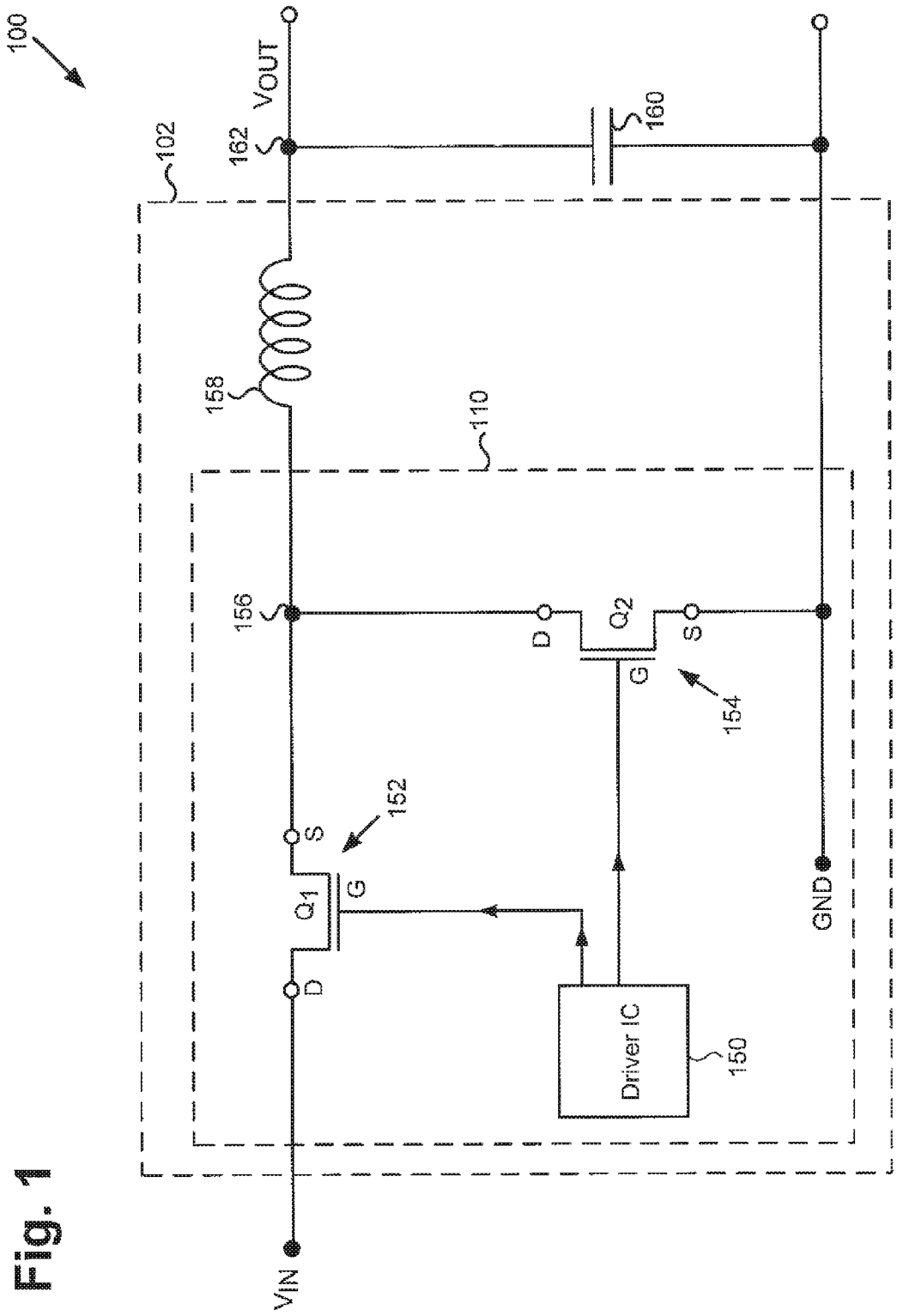
FIG. 1 illustrates a diagram of an exemplary circuit suitable for use as a power converter, according to one implementation of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIG. 1, FIG. 1 illustrates a diagram of an exemplary circuit suitable for use as a power converter, according to one implementation of the present disclosure. Power converter circuit 100 includes power converter package 102 and output capacitor 160. Power converter package 102 includes power stage 110 and output inductor 158. As shown in FIG. 1, power stage 110 includes high side or control transistor 152 ($Q_1$) coupled to low side or sync transistor 154 ($Q_2$) at switched node 156, as well as pulsewidth modulation (PWM) control and driver 150 coupled to control transistor 152 and sync transistor 154. It is noted that PWM control and driver 150 may be implemented as a PWM and control driver IC, and is configured to provide drive signals to the respective gates of control transistor 152 and sync transistor 154. As further shown in FIG. 1, power converter circuit 100 is configured to receive an input voltage $V_{IN}$, and to provide a converted voltage, e.g., a rectified and/or stepped down voltage, as $V_{OUT}$ at output node 162.

In the present implementation, control transistor 152 and sync transistor 154 of power stage 110 may take the form of metal-oxide-semiconductor field-effect transistors (MOSFETs) configured as a half-bridge, for example. That is to say, control transistor 152 may be coupled to sync transistor 154 at switched node 156, which, in turn, may be coupled to output node 162 through output inductor 158. In some implementations, control transistor 152 and sync transistor 154 may be implemented as group IV based power transistors, such as silicon power MOSFETs having a vertical or lateral design, for example. In other implementations, control transistor 152 and sync transistor 154 may be implemented as field-effect transistors (FETs), insulated gate bipolar transistors (IGBTs), or high electron mobility transistors (HEMTs), for example. In general, control transistor 152 and sync transistor 154 may be implemented as group IV power transistors, such as silicon power transistors, or as group III-V power transistors, such as gallium nitride (GaN) power transistors. In some implementations, it may be advantageous or desirable for at least one of control transistor 152 and sync transistor 154 to be implemented as a group III-V power transistor, such as a GaN power transistor, for example. Power converter circuit 100 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group Ill element or elements include some or a substantial amount of gallium, but may also include other group III elements in addition to gallium.

Figure 3A:
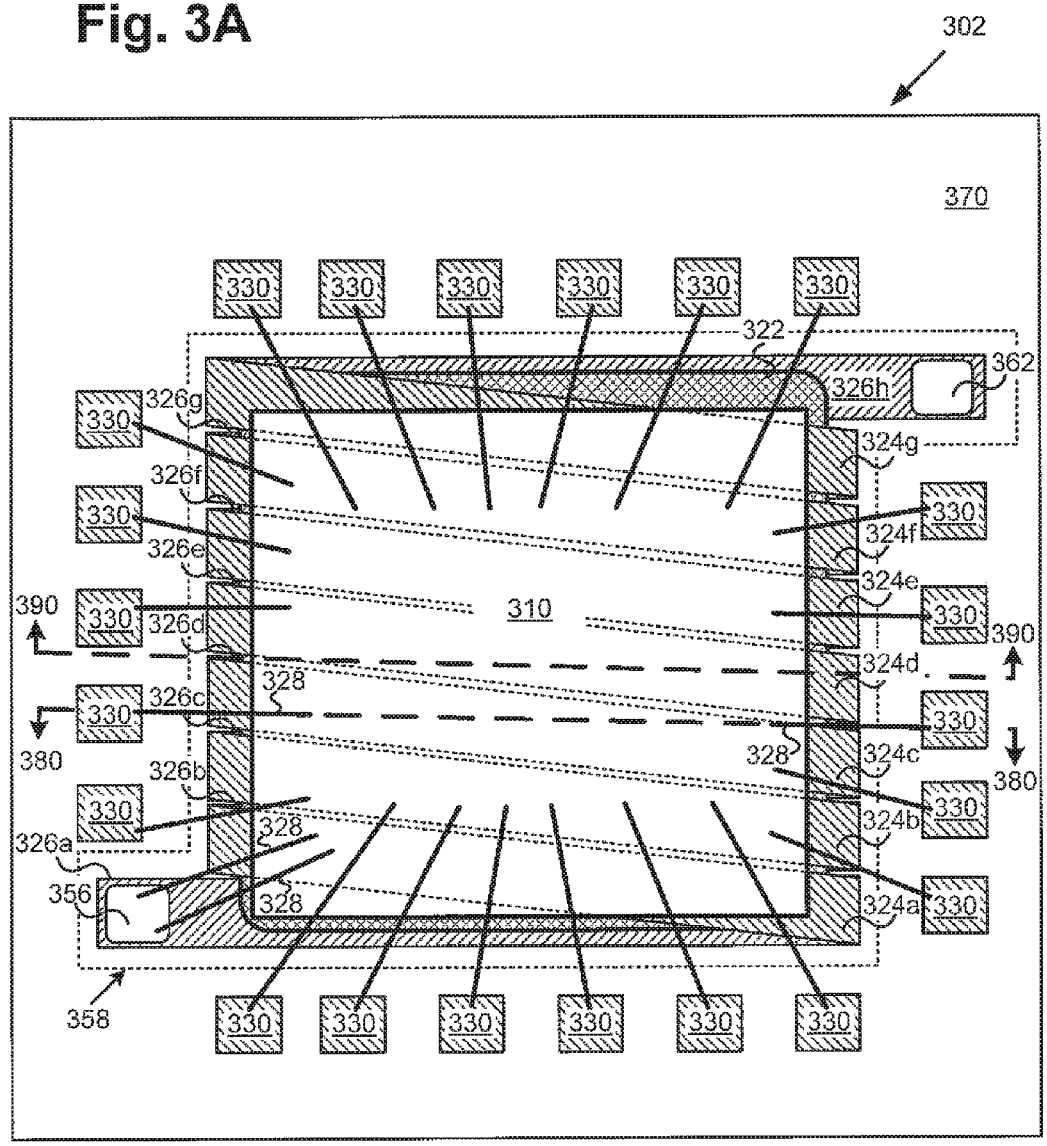
FIG. 3A illustrates a top plan view of a semiconductor package having an integrated output inductor, according to one implementation of the present disclosure.
Figure 3B:
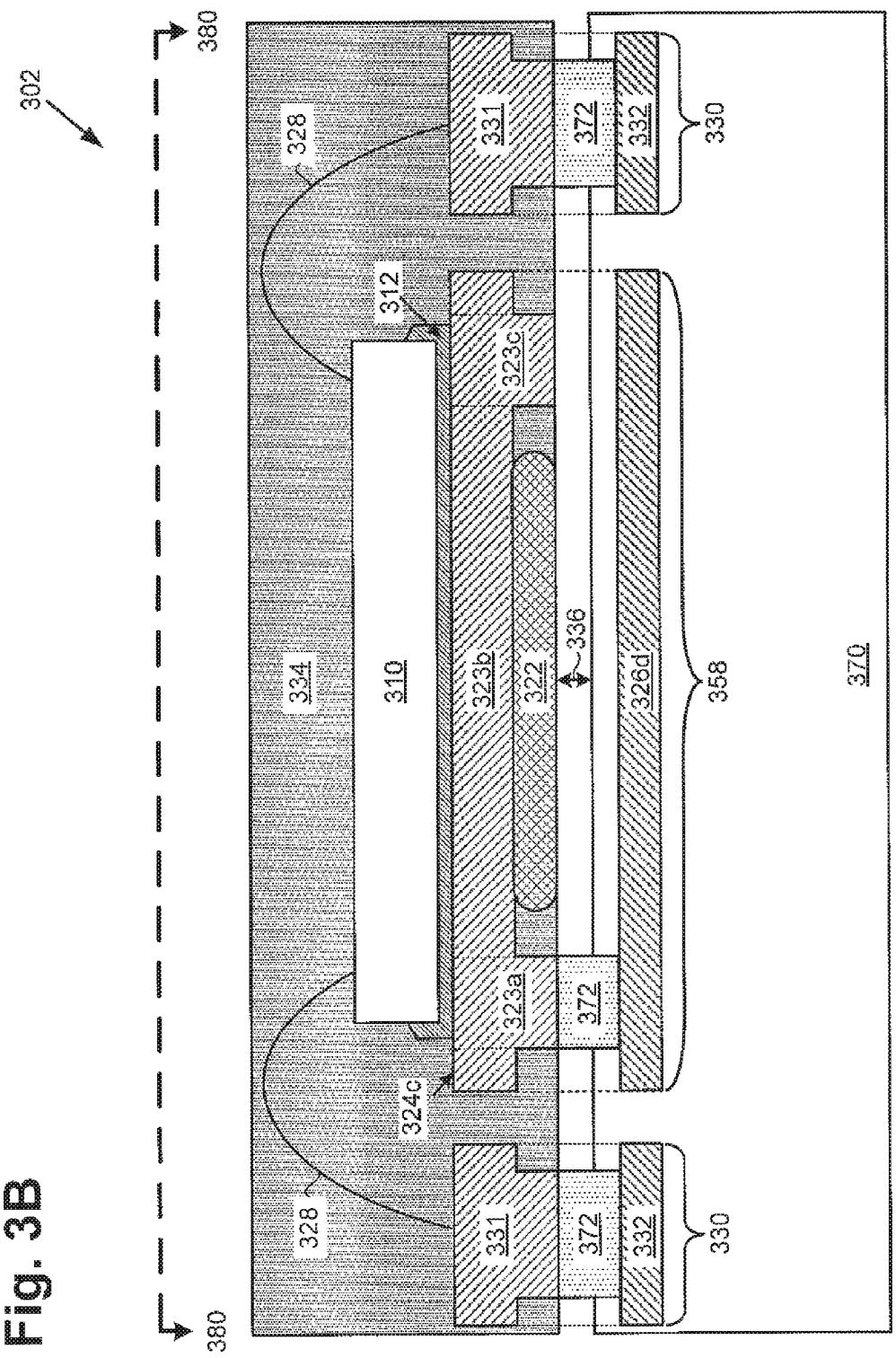
FIG. 3B illustrates a cross-sectional view of a semiconductor package having an integrated output inductor, according to one implementation of the present disclosure.
Figure 3C:
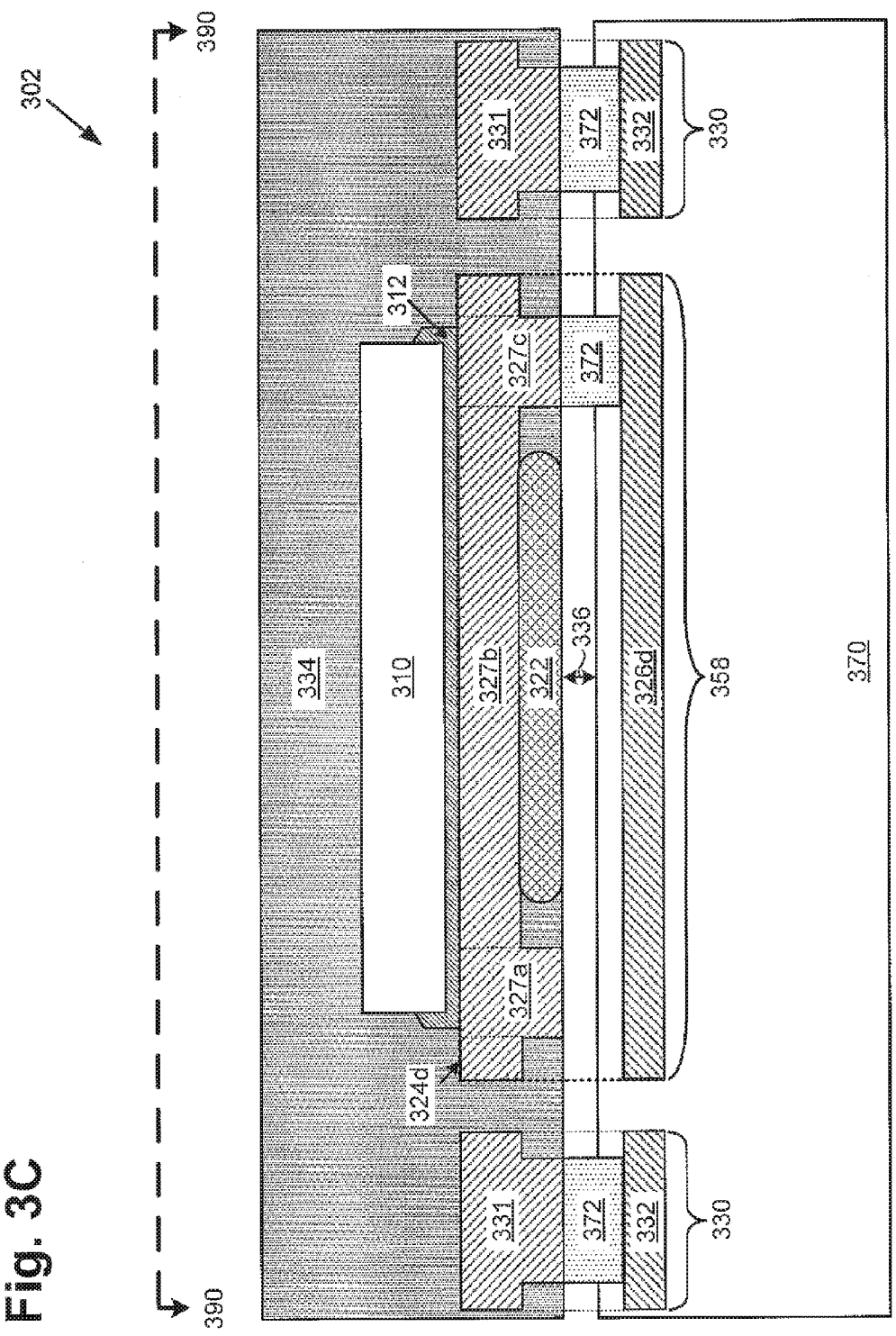
FIG. 3C illustrates a cross-sectional view of a semiconductor package having an integrated output inductor, according to one implementation of the present disclosure.

It should be noted with reference to the drawings of the present application that implementations of the present disclosure are described with respect to a power stage and an output inductor within a power semiconductor package, such as semiconductor die 310 having a power stage monolithically formed thereon and integrated output inductor 358 within power semiconductor package 302 of FIGS. 3A, 3B and 3C. Each semiconductor die 310 in FIGS. 3A, 3B and 3C may correspond to power stage 110 of FIG. 1 and each integrated output inductor 358 may correspond to output inductor 158 of FIG. 1. In some implementations, semiconductor die 310 corresponding to power stage 110, and integrated output inductor 358 corresponding to output inductor 158 may be electrically coupled to each other in a manner shown in power converter circuit 100 of FIG. 1.

As electronic devices and systems move toward ever smaller form factors, the large circuit board area still required to accommodate an output inductor, such as output inductor 158 in FIG. 1, becomes increasingly costly. As such, the present application discloses a packaging solution utilizing a stacked architecture enabling fabrication of a power semiconductor package including an integrated output inductor but requiring substantially no greater area than a package enclosing the power transistors and driver circuitry alone. Moreover, according implementations of the present disclosure, conductive clips having non-etched portions and partially etched portions, and conductive segments in a PCB, are utilized to form a continuous wire winding and embed a core within an interior space formed by the partially etched portions of the conductive clips, thereby further reducing the package height or thickness.

Figure 2:
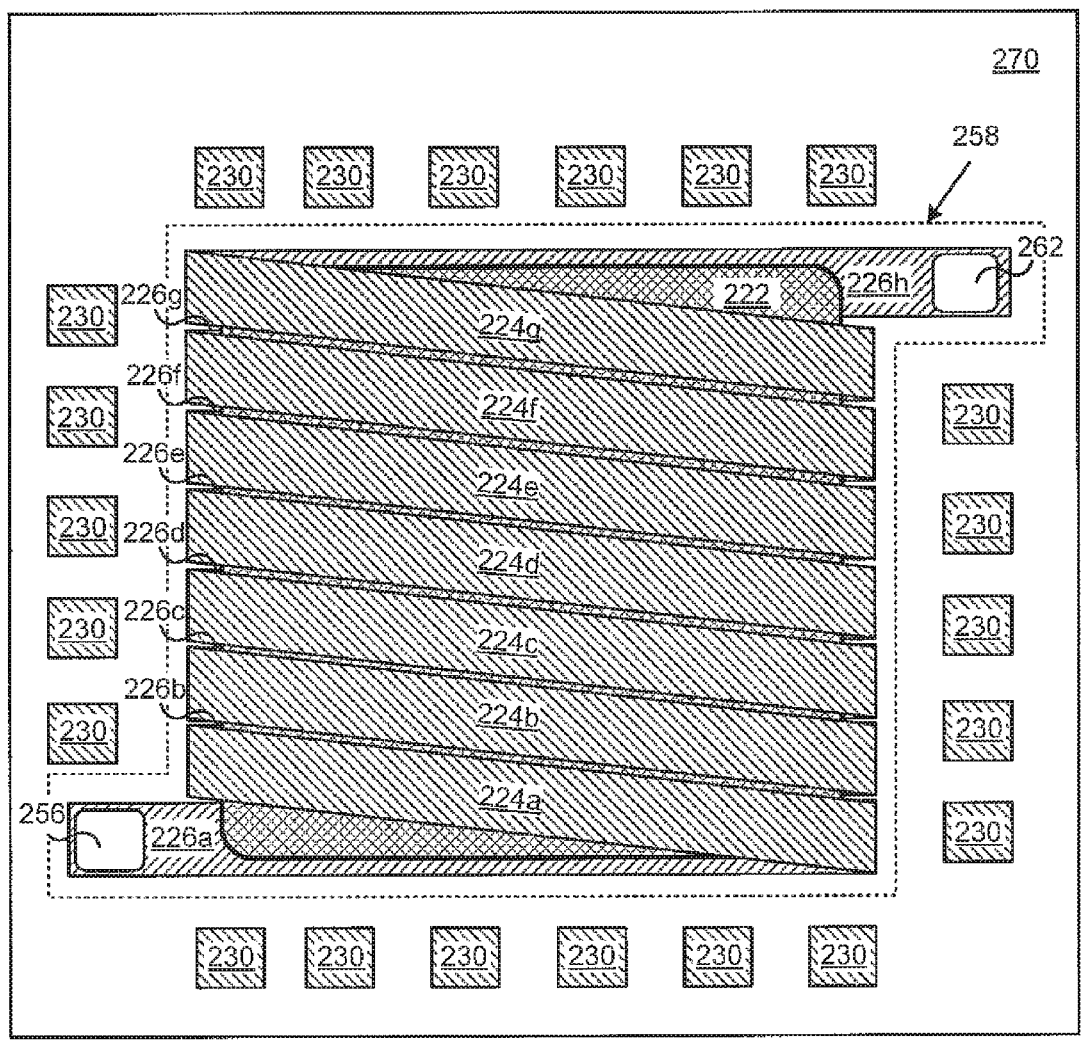
FIG. 2 illustrates a top plan view of an integrated output inductor, according to one implementation of the present disclosure.

Referring now to FIG. 2, FIG. 2 illustrates a top plan view of an integrated output inductor on a PCB, according to one implementation of the present disclosure. As illustrated in FIG. 2, integrated output inductor 258 includes core 222, conductive clips 224a, 224b, 224c, 224d, 224e, 224f and 224g (collectively referred to as "conductive clips 224"), conductive segments 226a, 226b, 226c, 226d, 226e, 226f, 226g and 226h (collectively referred to as "conductive segments 226"), and PCB 270. As illustrated in FIG. 2, conductive clips 224 are situated above PCB 270, while conductive segments 226 are formed in one or more metal layers (e.g., the topmost metal layer) in PCB 270, where conductive clips 224 are connected to conductive segments 226 to form a continuous wire winding wrapped around and substantially embedding core 222.

In the present implementation, integrated output inductor 258 may correspond to output inductor 158 in FIG. 1. As illustrated in FIG. 2, one end of integrated output inductor 258 is coupled to switched node pad 256 corresponding to switched node 156 in FIG. 1, while the other end of integrated output inductor 258 is coupled to output node pad 262 corresponding to output node 162 in FIG. 1.

As illustrated in FIG. 2, conductive clips 224a, 224b, 224c, 224d, 224e, 224f and 224g are substantially parallel to and spaced from one another above PCB 270, while conductive segments 226a, 226b, 226c, 226d, 226e, 226f, 226g and 226h are substantially parallel to and spaced from one another in PCB 270. As further illustrated in FIG. 2, conductive clips 224a, 224b, 224c, 224d, 224e, 224f and 224g are arranged at a slightly slanted angle from conductive segments 226a, 226b, 226c, 226d, 226e, 226f, 226g and 226h. As a result of this arrangement, conductive clip 224a connects conductive segment 226a to conductive segment 226b. Conductive clip 224b connects conductive segment 226b to conductive segment 226c. Conductive clip 224c connects conductive segment 226c to conductive segment 226d. Conductive clip 224d connects conductive segment 226d to conductive segment 226e. Conductive clip 224e connects conductive segment 226e to conductive segment 226f. Conductive clip 224f connects conductive segment 226f to conductive segment 226g. Conductive clip 224g connects conductive segment 226g to conductive segment 226h.

In the present implementation, core 222 includes a ferrite core. In other implementations, core 222 may include other suitable material, such as plastic, ferromagnetic or ceramic material. In the present implementation, conductive clips 224a, 224b, 224c, 224d, 224e, 224f and 224g may each include a partially etched portion and at least one non-etched portion, which are not explicitly shown in FIG. 2.

As illustrated in FIG. 2, I/O pads 230 are formed around the perimeters of integrated output inductor 258 for electrical connections for a power converter package as described in detail with reference to FIGS. 3A, 3B and 3C below. In some implementations, conductive clips 224a, 224b, 224c, 224d, 224e, 224f and 224g, conductive segments 226a, 226b, 226c, 226d, 226e, 226f, 226g and 226h, and I/O pads 230 may each include any conductive material having high current carrying capability and a suitably low electrical resistance. For example, conductive clips 224, conductive segments 226 and I/O pads 230 may each include copper, aluminum, or a metallic alloy. The thickness, length and depth of integrated output inductor 258 may vary to suit the needs of a particular application.

Referring now to FIG. 3A, FIG. 3A illustrates a top plan view of a semiconductor package having an integrated output inductor, according to one implementation of the present disclosure. As illustrated in FIG. 3A, semiconductor package 302 includes semiconductor die 310 stacked over integrated output inductor 358, where integrated output inductor 358 includes core 322, conductive clips 324a, 324b, 324c, 324d, 324e, 324f and 324g (collectively referred to as "conductive clips 324"), conductive segments 326a, 326b, 326c, 326d, 326e, 326f, 326g and 326h (collectively referred to as "conductive segments 326"), and PCB 370. Semiconductor die 310 is stacked over and coupled to integrated output inductor 358 by a die attach material (not explicitly shown in FIG. 3A).

In the present implementation, semiconductor die 310 may include a power stage (not explicitly shown in FIG. 3A), which may correspond to power stage 110 in FIG. 1, monolithically integrated thereon. Semiconductor die 310 may include a high side or control transistor (e.g., control transistor 152 in FIG. 1) coupled to a low side or sync transistor (e.g., sync transistor 154 in FIG. 1) at a switched node (e.g., switched node 156 in FIG. 1). Semiconductor die 310 may also include a PWM control and driver (e.g., PWM control and driver 150 in FIG. 1) coupled to the control transistor and the sync transistor. In an implementation, the PWM control and driver may be implemented as a PWM and control driver IC, and is configured to provide drive signals to the respective gates of the control transistor and the sync transistor. In an implementation, the power stage, having the control transistor and the sync transistor, is monolithically integrated on semiconductor die 310. It is noted that the PWM control and driver, the control transistor and the sync transistor are not explicitly shown in FIG. 3A, but may be monolithically integrated on semiconductor die 310 in any suitable method and/or manner known in the art.

In the present implementation, semiconductor die 310 may include group IV material, such as silicon. In another implementation, semiconductor die 310 may include group III-V material, such as gallium nitride (GaN). In some implementations, it may be advantageous or desirable for at least one of the control transistor and the sync transistor to be implemented as a group III-V power transistor, such as a GaN power transistor, for example.

In the present implementation, integrated output inductor 358 may correspond to integrated output inductor 258 in FIG. 2, which may correspond to output inductor 158 in FIG. 1. Integrated output inductor 358 includes switched node pad 356 and output node pad 362, which may correspond to respective switched node 156 and output node 162 in FIG. 1. As illustrated in FIG. 3A, switched node pad 356 is coupled to conductive segment 326a at one end of integrated output inductor 358, and output node pad 362 is coupled conductive segment 326h at the other end of integrated output inductor 358. In one implementation, conductive clips 324 and conductive segments 326 may each include any conductive material having high current carrying capability and a suitably low electrical resistance. For example, conductive clips 324 and conductive segments 326 may each include copper, aluminum, or a metallic alloy. The thickness, length and depth of integrated output inductor 358 may vary to suit the needs of a particular application.

As illustrated in FIG. 3A, conductive clips 324a, 324b, 324c, 324d, 324e, 324f and 324g are substantially parallel to and spaced from one another above PCB 370, while conductive segments 326a, 326b, 326c, 326d, 326e, 326f, 326g and 326h are substantially parallel to and spaced from one another in PCB 370. As further illustrated in FIG. 3A, conductive clips 324a, 324b, 324c, 324d, 324e, 324f and 324g are arranged at a slightly slanted angle from conductive segments 326a, 326b, 326c, 326d, 326e, 326f, 326g and 326h. As a result of this arrangement, conductive clip 324a connects conductive segment 326a to conductive segment 326b. Conductive clip 324b connects conductive segment 326b to conductive segment 326c. Conductive clip 324c connects conductive segment 326c to conductive segment 326d. Conductive clip 324d connects conductive segment 326d to conductive segment 326e. Conductive clip 324e connects conductive segment 326e to conductive segment 326f. Conductive clip 324f connects conductive segment 326f to conductive segment 326g. Conductive clip 324g connects conductive segment 326g to conductive segment 326h. As a result, conductive clips 324 and conductive segments 326 are connected to form a continuous wire winding around core 322.

The number of windings of the wire winding formed by conductive clips 324a, 324b, 324c, 324d, 324e, 324f and 324g, and conductive segments 326a, 326b, 326c, 326d, 326e, 326f, 326g and 326h, may range from a few to several hundred windings. Conductive clips 324a, 324b, 324c, 324d, 324e, 324f and 324g are connected to conductive segments 326a, 326b, 326c, 326d, 326e, 326f, 326g and 326h by using electrical connectors (not explicitly shown in FIG. 3A). The electrical connectors may include solder bodies, such as solder paste, for example. In other implementations, the electrical connectors may take the form of an electrically conductive die attach material. For example, electrically conductive die attach materials may include conductive epoxies, conductive sintered materials, or diffusion bonded materials. For example, electrically conductive die attach materials may include conductive epoxies, conductive sintered materials, or diffusion bonded materials.

In the present implementation, core 322 includes a ferrite core. In other implementations, core 322 may include other suitable material, such as plastic, ferromagnetic or ceramic material. In the present implementation, conductive clips 324a, 324b, 324c, 324d, 324e, 324f and 324g may each include a conductive clip having a partially etched portion and at least one non-etched portion, which are not explicitly shown in FIG. 3A. Conductive segments 326a, 326b, 326c, 326d, 326e, 326f, 326g and 326h may be situated below a top surface of PCB 370, and each have a substantially uniform thickness. In one implementation, conductive segments 326a, 326b, 326c, 326d, 326e, 326f, 326g and 326h may be segments of one or more metal layers (e.g., the topmost metal layer) in PCB 370.

Semiconductor package 302 also includes I/O pads 330 around the perimeters of integrated output inductor 358, where I/O pads 330 are electrically coupled to semiconductor die 310 through wire bonds 328, for example. As illustrated in FIG. 3A, wire bonds 328 are configured to electrically couple various terminals (not explicitly shown in FIG. 3A) at a top surface of semiconductor die 310 to respective I/O pads 330. Also, one or more wire bonds 328 are configured to electrically couple a switched node (e.g., switched node 156 in FIG. 1) of semiconductor die 310 to switched node pad 356 on conductive segment 326a. In some implementations, wire bonds 328 may each include copper, gold, or another suitable conductive material, for example. In other implementations, wire bonds 328 may be replaced by conductive ribbons or other connectors including conductive materials such as aluminum, copper, gold, and/or other metals or composite materials.

A packaging enclosure (not explicitly shown in FIG. 3A) is configured to encapsulate semiconductor die 310, die attach material 312, integrated output inductor 358, wire bonds 328, and I/O pads 330 to form an enclosed package. Packaging enclosure 334 may include any suitable substance, such as an encapsulant and/or a molding compound for providing mechanical and/or environmental protection for semiconductor package 302. In some implementations, semiconductor package 302 may be a quad-flat no-leads (QFN) package, such as a power QFN (PQFN) package.

Referring now to FIG. 3B, FIG. 3B illustrates a cross-sectional view of a semiconductor package having an integrated output inductor, according to one implementation of the present disclosure. In particular, FIG. 3B illustrates a cross-sectional view of semiconductor package 302 along line 380-380 in FIG. 3A. With similar numerals representing similar features in FIG. 3A, semiconductor package 302 in FIG. 3B includes semiconductor die 310 stacked over and attached to integrated output inductor 358 by die attach material 312. Integrated output inductor 358 includes, in part, core 322 and a winding having conductive clip 324c over PCB 370 and connected to conductive segment 326d in PCB 370. As illustrated in FIG. 3B, semiconductor package 302 also includes I/O pads 330 on the perimeters of integrated output inductor 358, and coupled to semiconductor die 310 through wire bonds 328. Packaging enclosure 334 is configured to encapsulate semiconductor die 310, die attach material 312, conductive clip 324c and core 222 of integrated output inductor 358, wire bonds 328, and top pads 331 of I/O pads 330.

As illustrated in FIG. 3B, conductive clip 324c includes non-etched portions 323a and 323c, and partially etched portion 323b. Non-etched portions 323a and 323c retain a full thickness of conductive clip 324c, while partially etched portion 323b has a thickness that is a fraction (e.g., half) of the full thickness of conductive clip 324c. In the present implementation, non-etched portions 323a and 323c have a substantially uniform thickness that is the full thickness of conductive clip 324c. Partially etched portion 323b also has a substantially uniform thickness that is a fraction of the full thickness of conductive clip 324c. Conductive segment 326d includes a conductive body having a substantially uniform thickness in PCB 370.

As illustrated in FIG. 3B, conductive clip 324c and conductive segment 326d form a winding around core 322, where non-etched portion 323a of conductive clip 324c is electrically and mechanically coupled to conductive segment 326d at one end (e.g., on the left hand side) of integrated output inductor 358 by using electrical connector 372, such as solder paste. Partially etched portion 323b of conductive clip 324c forms a recess in conductive clip 324c to provide an interior space for housing or embedding core 322. As shown in FIG. 3B, core 322 has a bottom surface that does not extend below a bottom surface of each of non-etched portions 323a and 323c of conductive clip 324c.

It is noted that, in the cross-sectional view shown in FIG. 3B, conductive clip 324c and conductive segment 326d are only connected at one end (e.g., on the left hand side) of integrated output inductor 358. This is because conductive clip 324c is situated above and arranged at a slightly slanted angle from conductive segment 326d (as shown in FIG. 3A). As a result of this arrangement, conductive segment 326d is connected to a non-etched portion (e.g., non-etched portion 327c in FIG. 3C) of conductive clip 324d (not explicitly shown in FIG. 3B), while non-etched portion 323c of conductive clip 324c is connected to conductive segment 326c (not explicitly shown in FIG. 3B). Thus, conductive clips 324 and conductive segments 326 are connected in such a way to form a continuous wire winding around core 322, as shown in FIG. 3A.

As illustrated in FIG. 3B, wire bonds 328 are configured to electrically couple various terminals (not explicitly shown in FIG. 3B) at a top surface of semiconductor die 310 to respective I/O pads 330. In the present implementation, I/O pads 330 each include top pad 331 connected to bottom pad 332 using electrical connector 372, such as solder paste. In the present implementation, top pad 331 of each I/O pad 330 includes a non-etched portion and a partially etched portion, as shown in FIG. 3B. Bottom pad 332 of each I/O pad 330 is formed in PCB 370, and has a substantially uniform thickness. In the present implementation, conductive segment 326d and bottom pads 332 of I/O pads 330 may be formed in a single processing action, while conductive clip 324c and top pads 331 of I/O pads 330 may be formed in a single processing action. In the present implementation, conductive clip 324c, conductive segment 326d and I/O pads 330 may each include any conductive material having high current carrying capability and a suitably low electrical resistance, such as copper, aluminum, or a metallic alloy.

As illustrated in FIG. 3B, in the present implementation, packaging enclosure 334 encapsulates semiconductor die 310, die attach material 312, conductive clip 324c and core 322 of integrated output inductor 358, wire bonds 328, and top pads 331 of I/O pads 330. Packaging enclosure 334 may include any suitable substance, such as an encapsulant and/or a molding compound for providing mechanical and/or environmental protection for semiconductor package 302.

As illustrated in FIG. 3B, conductive clip 324c and core 322 of integrated output inductor 358 are situated above and separated from PCB 370 by gap 336, such as an air gap. Gap 336 may provide sufficient clearance to enable enhanced thermal dissipation by allowing heat to radiate directly to ambient air, for example. In another implementation, gap 336 may be eliminated from semiconductor package 302 such that conductive clip 324c and core 322 of integrated output inductor 358, as well as top pads 331 of I/O pads 330, are situated above and in contact with PCB 370.

Referring now to FIG. 3C, FIG. 3C illustrates a cross-sectional view of a semiconductor package having an integrated output inductor, according to one implementation of the present disclosure. In particular, FIG. 3C illustrates a cross-section of semiconductor package 302 along line 390-390 in FIG. 3A. With similar numerals representing similar features in FIG. 3A, semiconductor package 302 in FIG. 3C includes semiconductor die 310 stacked over and attached to integrated output inductor 358 by die attach material 312. Integrated output inductor 358 includes, in part, core 322 and a winding having conductive clip 324d over PCB 370 and connected to conductive segment 326d in PCB 370. As illustrated in FIG. 3C, semiconductor package 302 also includes I/O pads 330 on the perimeters of integrated output inductor 358. Packaging enclosure 334 is configured to encapsulate semiconductor die 310, die attach material 312, conductive clip 324d and core 222 of integrated output inductor 358, wire bonds 328, and top pads 331 of I/O pads 330.

As illustrated in FIG. 3C, conductive clip 324d, similar to conductive clip 324c in FIG. 3B, includes non-etched portions 327a and 327c, and partially etched portion 327b. Non-etched portions 327a and 327c retain a full thickness of conductive clip 324d, while partially etched portion 327b has a thickness that is a fraction (e.g., half) of the full thickness of conductive clip 324d. In the present implementation, non-etched portions 327a and 327c have a substantially uniform thickness that is the full thickness of conductive clip 324d. Partially etched portion 327b also has a substantially uniform thickness that is a fraction of the full thickness of conductive clip 324d. Conductive segment 326d includes a conductive body having a substantially uniform thickness in PCB 370.

As illustrated in FIG. 3C, conductive clip 324d and conductive segment 326d form a winding around core 322, where non-etched portion 327c of conductive clip 324d is electrically and mechanically coupled to non-etched portion 325c of conductive segment 326d at one end (e.g., on the right hand side) of integrated output inductor 358 by using electrical connector 372, such as solder paste. Partially etched portion 327b of conductive clip 324d forms a recess in conductive clip 324d to provide an interior space for housing or embedding core 322. As shown in FIG. 3C, the bottom surface of core 322 does not extend below a bottom surface of each of non-etched portions 327a and 327c of conductive clip 324d.

It is noted that, in the cross-sectional view shown in FIG. 3C, conductive clip 324d and conductive segment 326d are only connected at one end (e.g., on the right hand side) of integrated output inductor 358. This is because conductive clip 324d is situated above and arranged at a slightly slanted angle from conductive segment 326d (as shown in FIG. 3A). As a result of this arrangement, conductive segment 326d is connected to a non-etched portion (e.g., non-etched portion 323a in FIG. 3B) of conductive clip 324c (not explicitly shown in FIG. 3C), while non-etched portion 327a of conductive clip 324d is connected to conductive segment 326e (not explicitly shown in FIG. 3C). Thus, conductive clips 324 and conductive segments 326 are connected in such a way to form a continuous wire winding around core 322, as shown in FIG. 3A.

As illustrated in FIG. 3C, I/O pads 330 each include top pad 331 connected to bottom pad 332 by using electrical connector 372, such as solder paste. Top pad 331 of each I/O pad 330 may include a non-etched portion and a partially etched portion, as shown in FIG. 3C. Bottom pad 332 of each I/O pad 330 is formed in PCB 370, and has a substantially uniform thickness. In the present implementation, conductive segment 326d and bottom pads 332 of I/O pads 330 may be formed in a single processing action, while conductive clip 324d and top pads 331 of I/O pads 330 may be formed in a single processing action. In the present implementation, conductive clip 324d, conductive segment 326d and I/O pads 330 may each include any conductive material having high current carrying capability and a suitably low electrical resistance, such as copper, aluminum, or a metallic alloy.

As illustrated in FIG. 3C, in the present implementation, packaging enclosure 334 encapsulates semiconductor die 310, die attach material 312, conductive clip 324d and core 322 of integrated output inductor 358, and top pads 331 of I/O pads 330. Packaging enclosure 334 may include any suitable substance, such as an encapsulant and/or a molding compound for providing mechanical and/or environmental protection for semiconductor package 302.

As illustrated in FIG. 3C, conductive clip 324d and core 322 of integrated output inductor 358 are situated above and separated from PCB 370 by gap 336, such as an air gap. Gap 336 may provide sufficient clearance to enable enhanced thermal dissipation by allowing heat to radiate directly to ambient air, for example. In another implementation, gap 336 may be eliminated from semiconductor package 302 such that conductive clip 324d and core 322 of integrated output inductor 358, as well as top pads 331 of I/O pads 330, are situated above and in contact with PCB 370.

As illustrated in FIGS. 3A, 3B and 3C, because core 322 of integrated output inductor 358 is embedded in the interior space formed by partially etched portions of conductive clips 324, the overall height of integrated output inductor 358 can be significantly reduced, which in turn reduces the form factor of semiconductor package 302. In contrast to conventional power semiconductor packages having individual semiconductor dies arranged side by side with output inductors over a top surface of a PCB, because semiconductor die 310 is situated over integrated output inductor 358, in accordance with the present implementation, semiconductor package 302 can advantageously have a reduced footprint, thereby further reducing the form factor of semiconductor package 302. Moreover, because conductive segments 326 in PCB 370 are used to connect with conductive clips 324 over PCB 370 to form a continuous winding around core 322, a portion of integrated output inductor 358 is formed in PCB 370, thereby further reducing the overall height of integrated output inductor 358.

Also, by employing conductive clips 324 and conductive segments 326 to form a continuous wire winding around core 322, with a space between each adjacent pair of conductive clips 324, packaging enclosure 334 can occupy the recesses provided by the partially etched portions of conductive clips 324 around core 322 to provide mechanical support and hold core 322 in place. Also, packaging enclosure 334 can encapsulate semiconductor die 310 and integrated output inductor 358 in a single encapsulation action, thereby reducing manufacturing time and cost. Packaging enclosure 334 can have excellent thermal conductivity to transfer heat away from semiconductor die 310 and integrated output inductor 358. In addition, as core 322 is exposed on its bottom surface, semiconductor package 302 can provide enhanced thermal dissipation by radiating heat directly to ambient air, for example.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor package comprising:
a core of an output inductor;
a plurality of discrete conductive clips of the output inductor each situated over and in contact with the core of the output inductor; and
a semiconductor die situated over the plurality of discrete conductive clips;
wherein each one of the plurality of discrete conductive clips comprises a first segment and a second segment that each extend away from a third segment to bridge the core of the output inductor so that the plurality of discrete conductive clips together form a first half of a winding of the output inductor external a printed circuit board and so that the plurality of discrete conductive clips are configured to be connected to corresponding conductive segments in the printed circuit board that together form a second half of the winding of the output inductor.

2. The semiconductor package of claim 1 wherein the semiconductor die comprises a control transistor and a sync transistor configured as a half-bridge.

3. The semiconductor package of claim 2 wherein the semiconductor die further comprises a driver integrated circuit coupled to the control transistor and the sync transistor.

4. The semiconductor package of claim 2 wherein at least one of the control transistor and the sync transistor comprises a group III-V transistor.

5. The semiconductor package of claim 2 wherein at least one of the control transistor and the sync transistor comprises a group IV transistor.

6. The semiconductor package of claim 2 wherein the plurality of discrete conductive clips are configured to be electrically coupled to a switched node of the half-bridge.

7. The semiconductor package of claim 1 wherein at least one of the plurality of discrete conductive clips includes an etched portion and a non-etched portion.

8. The semiconductor package of claim 1 wherein the core is a ferrite core.

9. The semiconductor package of claim 1 wherein the semiconductor die is coupled to the plurality of discrete conductive clips by a die attach material.

10. The semiconductor package of claim 1 wherein the core, the plurality of discrete conductive clips and the semiconductor die are encapsulated in a molding compound.

11. A semiconductor package comprising:
a stack comprising a core of an output inductor, a plurality of conductive clips of the output inductor, and a power stage;
wherein each one of the plurality of conductive clips comprises a first segment, a second segment and a third segment, wherein the first segment and second segment each extend away from the third segment to bridge the core of the output inductor so that the plurality of conductive clips together define a first half of a winding of the output inductor external a printed circuit board and so that the plurality of conductive clips are configured to be connected to corresponding conductive segments in the printed circuit board that together define a second half of the winding of the output inductor when coupled to corresponding ones of the plurality of conductive clips.

12. The semiconductor package of claim 11 wherein at least one of the plurality of conductive clips includes an etched portion and a non-etched portion.

13. The semiconductor package of claim 11 wherein the plurality of conductive clips are configured to be electrically coupled to a switched node of a half-bridge defined by a control transistor and a sync transistor of the power stage.

14. The semiconductor package of claim 13 wherein the power stage further comprises a driver integrated circuit coupled to the control transistor and the sync transistor.

15. The semiconductor package of claim 13 wherein at least one of the control transistor and the sync transistor comprises a group III-V transistor.

16. The semiconductor package of claim 13 wherein at least one of the control transistor and the sync transistor comprises a group IV transistor.

17. The semiconductor package of claim 13 wherein the control transistor and the sync transistor are monolithically integrated on a semiconductor die.

18. The semiconductor package of claim 17 wherein the semiconductor die is attached to the plurality of conductive clips by a die attach material.

19. The semiconductor package of claim 11 wherein the stack is encapsulated in a molding compound.

20. The semiconductor package of claim 11 wherein the core is a ferrite core.

* * * * *